United States Patent [19]

Nagura et al.

[11] 4,187,525
[45] Feb. 5, 1980

[54] GROUND FAULT PROTECTIVE APPARATUS OF FIELD WINDINGS

[75] Inventors: Yukihiro Nagura, Iama; Yoshihiko Toda, Koganei, both of Japan

[73] Assignee: Tokyo Shibaura Denki Kabushiki Kaisha, Kanagawa, Japan

[21] Appl. No.: 879,807

[22] Filed: Feb. 21, 1978

[30] Foreign Application Priority Data

Feb. 23, 1977 [JP] Japan .................................. 52-18087

[51] Int. Cl.$^2$ ........................................... H02H 7/06
[52] U.S. Cl. ....................................... 361/42; 322/25;
322/59; 361/79; 361/20; 364/482
[58] Field of Search ...................... 361/42, 20, 47–50,
361/79, 80, 82, 21; 322/25, 59, 69; 235/302.1,
303; 364/480–483, 492

[56] References Cited

U.S. PATENT DOCUMENTS

| 2,825,006 | 2/1958 | Leppla | 361/42 X |
| 3,286,129 | 11/1966 | Gagniere | 361/47 |
| 3,631,321 | 12/1971 | Eisenstadt | 361/42 X |
| 4,107,778 | 8/1978 | Nii et al. | 364/492 |

OTHER PUBLICATIONS

"Generator-und-Anlagenschutz Rotorords Chlusschutzrelais", IWX161 Zusatzgeraet YWXIII, by Brown Boveri & Company Ltd., 25-8-75.

Primary Examiner—Patrick R. Salce
Attorney, Agent, or Firm—Stevens, Davis, Miller & Mosher

[57] ABSTRACT

A resistor, a DC source and a current converter are connected in series between one terminal of the field winding and the ground. When a ground fault occurs on the field winding, it is detected by the output of a voltage detector connected across the resistor or the output of the current converter, and an alarm device is operated. At the same time, another resistor is connected between the other terminal of the field winding and the current converter through a switch, and the magnitude of the ground fault is calculated by the outputs of the voltage detector and of the current converter before and after closure of the switch. When the magnitude of the ground fault is large the generator is disconnected.

3 Claims, 7 Drawing Figures

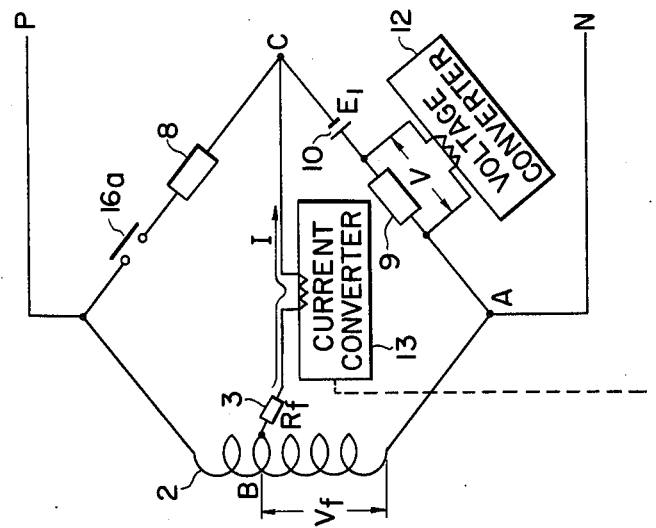
F I G. 5
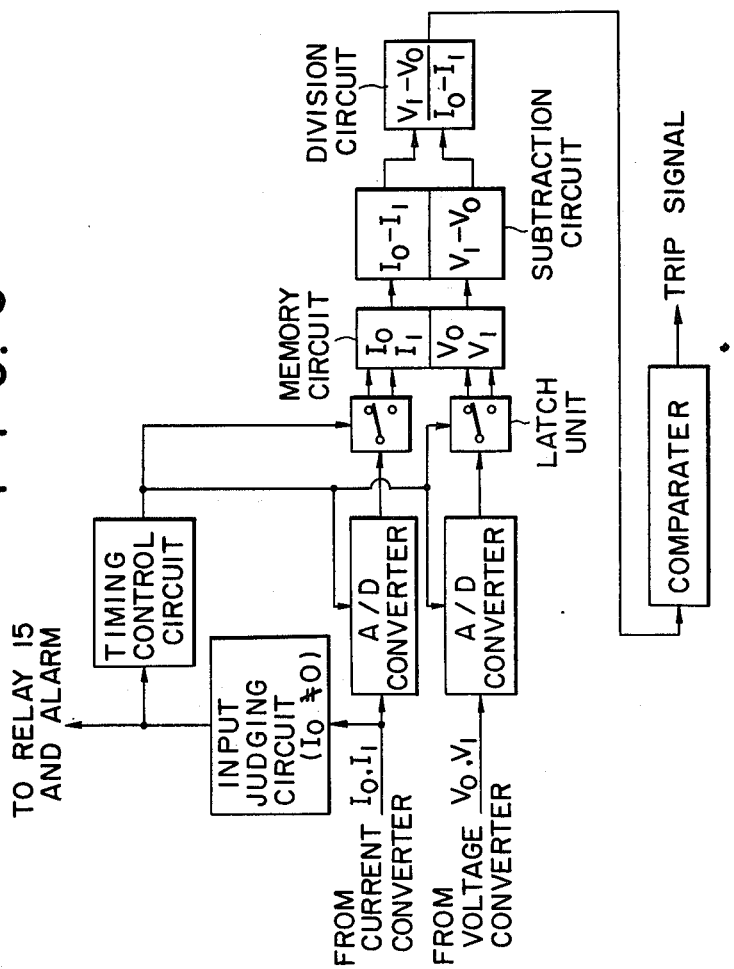
F I G. 6

GROUND FAULT PROTECTIVE APPARATUS OF FIELD WINDINGS

BACKGROUND OF THE INVENTION

This invention relates to apparatus for detecting a ground fault of the field winding of a synchronous machine.

In a prior art apparatus for detecting a ground fault of the field winding of a synchronous machine, particularly an alternator, upon detection of a fault, the alternator is not tripped immediately but only an alarm display is made. Because, the field circuit of the alternator is not grounded, a one point ground fault would not result in any serious fault, and only when two or more points of the field winding are grounded simultaneously will heavy faults which can burn out the alternator occur. Accordingly, in the case of a single point ground fault the operator of a power station stops the alternator after consulting with a central supervisory station and after performing various preparatory procedures.

However, the increased capacity of an alternator in recent years makes it impossible to disconnect the alternator from the power system on the ground of a simple fault because disconnection of the alternator results in a large disturbance of the power system. However, when the operation of the alternator is continued is spite of the occurrence of a low resistance ground fault of its field winding there is a danger of causing grounding at two or more points.

For this reason, it has been desired to develop a protective system which gives an alarm but permits the operation of the alternator when a high resistance field ground fault occurs which would not damage the alternator seriously, even when the fault develops into a two point grounding, but immediately disconnects the alternator in case of a low resistance field ground fault which may result in a serious fault. However, it has been difficult to judge the magnitude of the grounding resistance during the operation of the alternator.

SUMMARY OF THE INVENTION

It is therefore an object of this invention to provide a novel ground fault detecting apparatus for the field winding of a synchronous dynamo electric machine which permits the machine to continue its operation when the fault is light thereby preventing a disturbance of the power system but disconnects the machine when the fault is heavy thereby positively protecting the machine.

According to this invention, this object can be accomplished by providing a ground fault protective apparatus of a field winding of a synchronous dynamo electric machine comprising a first impedance, a source of direct current, and a current converter which are connected in series between one terminal of the field winding and the ground for passing a ground fault current of the field winding, a voltage detector for detecting the voltage drop across the first impedance, a second impedance connected between the other terminal of the field winding and the current converter through a switch, means responsive to the output of either one of the current converter and the voltage detector for detecting the ground fault, memory means for storing the outputs of the current converter and the voltage detector when the ground fault is detected by the ground fault detecting means, means for closing the switch for passing current from the other terminal of the field winding through the second impedance and the current converter when the ground fault is detected, and means for calculating ground resistance of the ground fault by using the outputs of the current converter and of the voltage detector before and after closure of the switch thereby judging the magnitude of the fault.

When the detected fault is light, the machine is operated continuously thereby avoiding disturbance of the power system whereas when the fault is heavy the machine is immediately disconnected from the power system thus positively protecting the machine.

BRIEF DESCRIPTION OF THE DRAWINGS

In the accompanying drawings:

FIG. 5 is an equivalent circuit showing the principle of operation of the field ground fault detection apparatus shown in FIG. 4;

FIG. 6 is a block diagram showning the detail of the computer shown in FIG. 5.

DESCRIPTION OF THE PREFERRED EMBODIMENT

Figure 1:
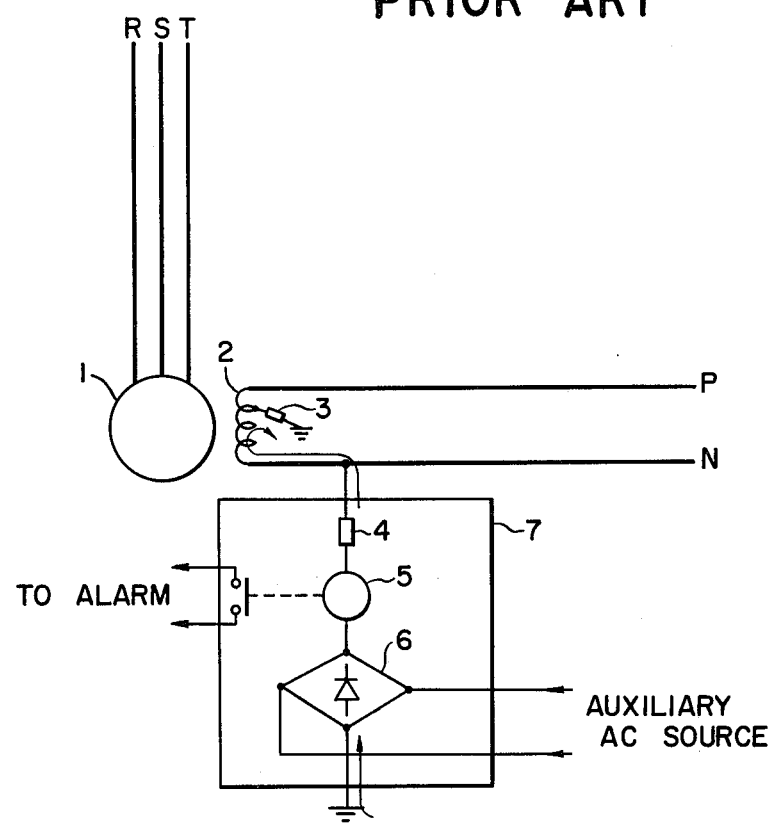
FIG. 1 is a connection diagram showing one example of a prior art field ground fault detection apparatus.

One terminal of a prior art ground fault detection apparatus 7 shown in FIG. 1 for detecting the ground fault of the field winding 2 of an alternator 1 is connected to one terminal of the field winding 2 and the other terminal of the apparatus 7 is grounded. Should a ground fault 3 occurs in the field winding 2, a circulating current flows through a rectifier 6, a resistor 4 and a protective relay 5 as shown by arrows thus operating an alarm device not shown.

Figure 2:
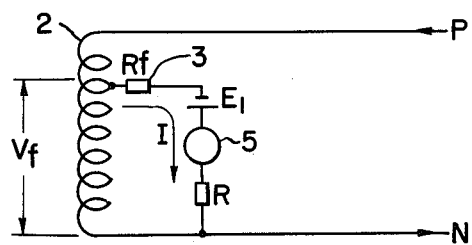
FIG. 2 is an equivalent circuit showing the principle of detecting a ground fault of the apparatus shown in FIG. 1

As above described, the detection apparatus can detect the occurence of a ground fault but can not judge the magnitude thereof as will be explained hereunder with reference to the equivalent circuit shown in FIG. 2 in which relay 5 is shown connected to the field winding 2 through grounding resistor 3. The current flowing through relay 5 is expressed by an equation.

$$I = (V_f + E_f)/(R_f + R) \tag{1}$$

where $R_f$: grounding resistance value,

R: internal resistance of the ground fault detecting apparatus 7, $V_f$: voltage at a point of the field winding at which the fault has occurred, $E_f$: DC voltage produced by rectifier 6 shown in FIG. 1, I: ground current.

The relay 5 is current type relay which responds to the ground current exceeding a predetermined value.

Figure 3:
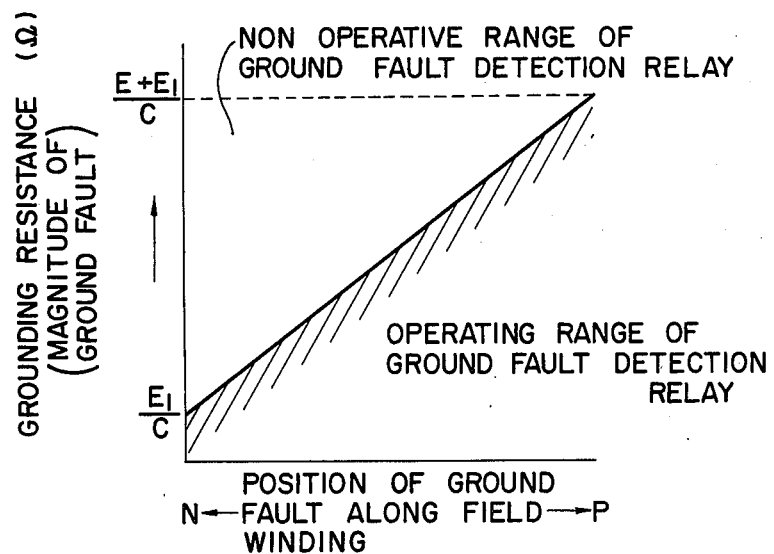
FIG. 3 is a graph showing the ground fault detection sensitively characteristic of the apparatus shown in FIG. 1.

However, as the voltage $V_f$ varies depending upon the ground position along the field winding it is impossible to obtain a sensitivity characteristic which depends only upon the magnitude of the grounding resistance. The actual sensitivity characteristic is shown in FIG. 3 in which E represents the voltage applied to the field circuit, C a constant determined by the operation sensitivity of relay 5, and P and N the positive and negative terminal positions respectively of the field winding.

At present, field voltage higher than 600 V is used so that the detection error due to voltage $V_f$ at the point on the field winding at which a ground fault has occurred is large. Accordingly, the detection sensitivity differs ten times or more when the ground fault occurs at the positive terminal of the field winding and at the negative terminal. Accordingly, with this system although it is possible to detect the ground fault in response to the flow of the ground current it is impossible to judge the magnitude of the fault because the magnitude of the ground current and the magnitude of ground fault do not correspond with each other due to the difference in the detection sensitivity described above.

The invention contemplates the provision of an improved ground fault protective apparatus of the field winding of an alternator wherein the magnitude of the ground fault is detected so as to continue or not continue the operation of the alternator.

Figure 4:
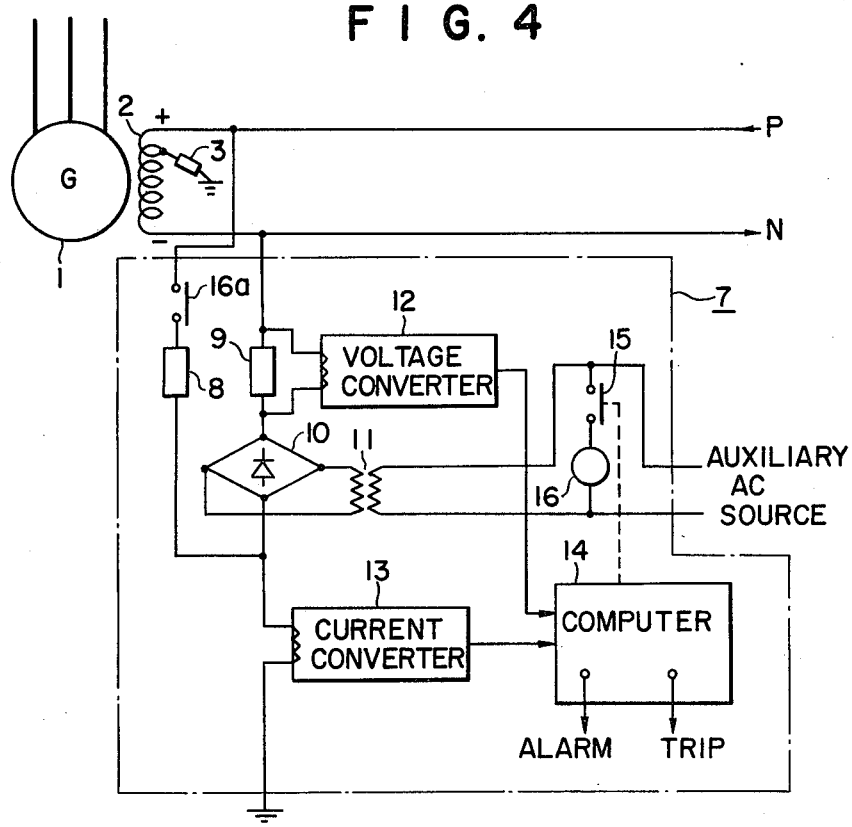
FIG. 4 is a connection diagram showing one embodiment of the field ground fault detection apparatus embodying the invention and capable of detecting and judging the magnitude of the ground fault.

In a preferred embodiment of this invention shown in FIG. 4 wherein certain elements corresponding to those shown in FIG. 1 are designated by the same reference numerals, the ground fault detecting apparatus 7 comprises resistors 8 and 9, a rectifier 10 connected in series with the field winding 2 and energized by an AC auxiliary source through a transformer 11, a voltage converter or detector 12 connected across resistor 9, a current converter 13 connected in series with rectifier 10 and a computer 14 energized by the outputs of the voltage converter 12 and of the current converter 13 for detecting the ground fault and for calculating the magnitude of the ground fault. The computer 14 actuates a contact 15 connected in series with an auxiliary relay 16 having a contact 16a connected in series with resistor 8.

In the absence of the ground fault, contact 16a of the auxiliary relay 16 is opened so that the ground fault detecting apparatus 7 is not connected to the positive side of the field winding 2. Upon occurrence of a ground fault, a portion of the field current flows through the ground fault 3, current converter 13, rectifier 10, resistor 9 and the ground. In response to the output of the current detector 13 or the voltage converter 12, the computer 14 detects the occurrence of the ground fault and operates an alarm device. At the same time, the computer calculates the magnitude of the grounding resistance in the following manner.

Although detailed description will be made later with reference to FIG. 6, the computer 74 applies the inputs from voltage converter 12 and current converter 13, that is voltage $V_0$ and current $I_0$, to an analogue digital converter and stores the converted digital values in a memory device, and then closes contact 15 to operate the auxiliary relay 16. Then its contact 16a is closed to connect the juncture between rectifier 10 and current converter 13 to the positive terminal of the field winding through resistor 8. Then, current is supplied to the ground fault detecting apparatus from the positive side so that the values of the voltage and current supplied to the computer 14 from the voltage and current converters also vary to $V_l$ and $I_l$.

In response to these new values $V_l$ and $I_l$, and previously stored values $V_0$ and $I_0$, the computer 14 calculates the value $R_f$ of the grounding resistance according to the following equation $$R_f = (V_l - V_0)/(I_0 - I_l) \qquad 2$$

Holding of equation 2 can be proven by FIG. 5 which shows an equivalent circuit of the circuit shown in FIG. 4. More particularly, the current flowing through the grounding resistance 3 is detected by the current converter 13 and the voltage across the resistor 9 is detected by the voltage detector 12.

As shown, an auxiliary detection voltage $E_l$ produced by rectifier 10 is applied between the current converter 13 and the voltage converter 12 so that even when the ground fault occurs at or near the negative terminal of the field winding current flows through the current converter 13 thus enabling to detect the fault.

The following relationship holds in a loop A-B-C-A, FIG. 5, according to Kirchhoff's Law $$V_f + E_l - V = R_f I \qquad 3$$

where $V_f$ represents the voltage at a point along the filed winding at which the ground fault has occurred (measured from the negative terminal), $E_l$ the measuring auxiliary voltage, V the voltage drop across resistor 9 and detected by the voltage detector 12, $R_f$ the grounding resistance and I the grounding current detected by the current converter 13.

When contact 16a of the auxiliary relay 16 is closed, the values of V and I of equation 3 vary greatly due to the current supplied through resistor 8, but the value of V does not vary. This is because the value of the field current flowing through the field winding is of the order of several hundreds to several thousands amperes whereas the current supplied to the detecting apparatus can be limited to the order of only few milliamperes irrespective of whether the auxiliary contact is operated or not so long as the values of resistors 8 and 9 are selected to be about several kilohms. Thus, the latter is negligibly small when compared with the actual field current. Since the field current does not vary appreciably by the operation of the auxiliary relay 16, voltage $V_f$ is substantially constant.

Furthermore, the values of $R_f$ and $E_l$ are always constant, the following equations 4 and 5 are derived from equation 3 when the contact 16a is opened and closed.

$$V_f + E_l - V_0 = R_f I_0 \qquad 4$$

$$V_f + E_l - V_l = R_f I_l \qquad 5$$

By subtracting equation 4 from equation 5, equation 2 can be obtained.

Computer 14 calculates the value of the grounding resistance by performing the following mathematical operations according to equation 2.

Thus, $(I_0 - I_l)$ and $(V_l - V_0)$ are calculated by applying $I_0$, $I_l$ and $V_0$, $V_l$ to a subtraction circuit from the memory. Then the output of the subtraction circuit is applied to a division circuit where the value of the grounding resistance $(V_l - V_0)/(I_0 - I_l)$ is calculated.

When the calculated value is smaller than a predetermined reference value the computer produces a system trip signal by judging that the fault is a low resistance ground fault thus disconnecting the alternator from the power system.

The computer 14 may be constructed by digital integrated circuits having memory and calculating cabilities. FIG. 6 shows one example of the computer. Since the principal elements and their operation have already been described hereinabove, it is only mentioned that an input judging circuit is provided for producing a signal for operating relay 16 and an alarm device when $I_0 \neq 0$. In response to the output of the input judging circuit a timing control circuit controls two A/D converters and two latch units connected between two A/D converters and two memory circuits.

Instead of connecting the input judging circuit to the output of the current converter, it is possible to connect it to the output of of the voltage converter because the purpose of this circuit is to detect the occurence of the ground fault.

Figure 7:
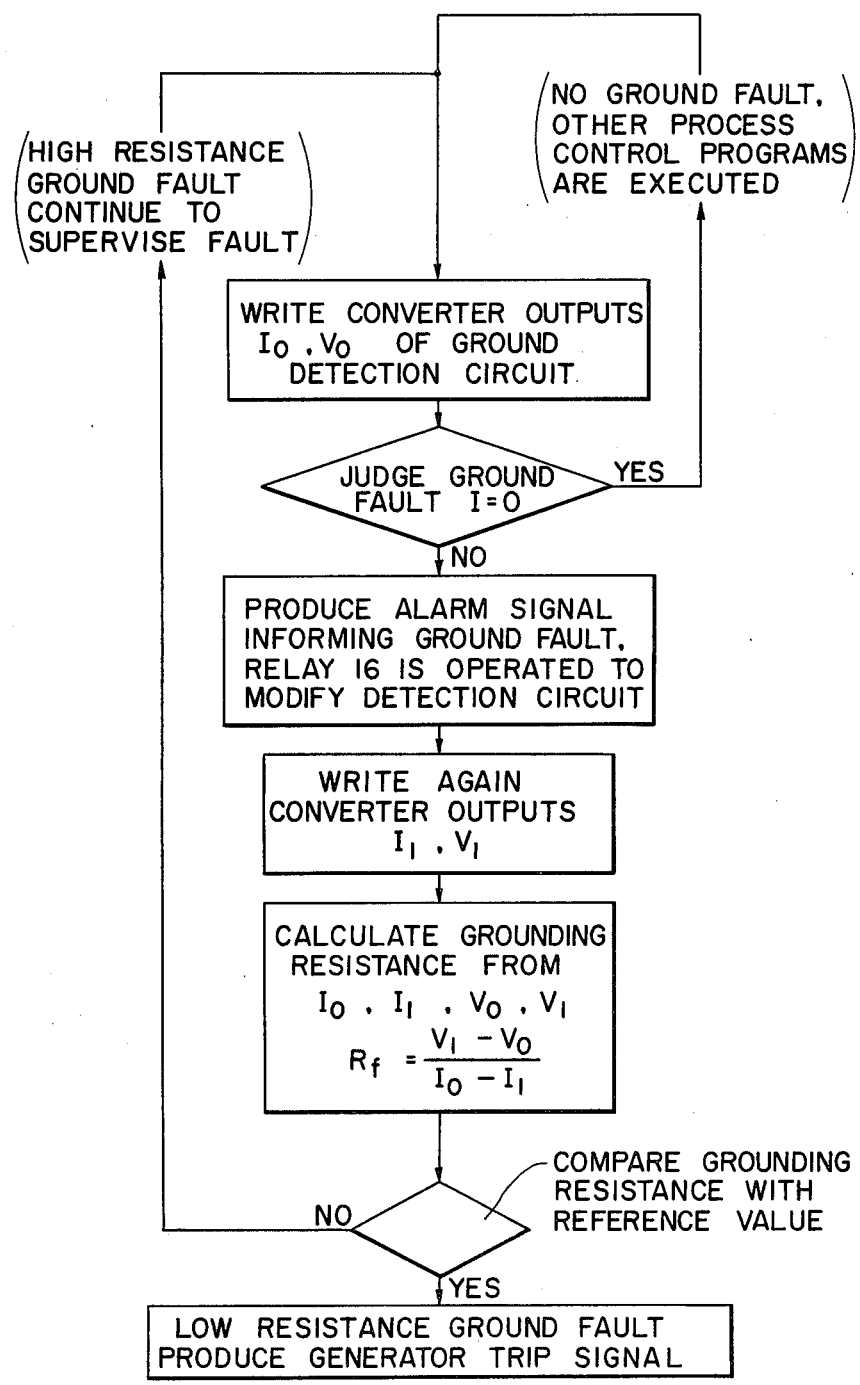
FIG. 7 is a program flow chart showing the operation of a process computer utilized as the computer shown in FIG. 5.

When a suitable process computer is incorporated into the power plant, it is possible to use it as the computer 14 by adding a program adapted to perform the calculations described above to the program of the process computer. FIG. 7 shows a flow chart of such modified process computer.

As above described according to this invention, it is possible to readily determine the magnitude of the grounding resistance when a ground fault occurs on the field winding thereby improving the power system stability by avoiding useless interruption of the alternator.

While the invention has been described in terms of an alternator, it should be understood that the invention is equally applicable to other type of synchronous machines such as synchronous motors and synchronous condensers.

We claim:

1. Ground fault protective apparatus for a field winding of a synchronous dynamo electric machine comprising a first impedance, a source of direct current, and a current converter which are connected in series between one terminal of said field winding and ground for passing ground fault current of said field winding, a voltage detector for detecting voltage drop across said first impedance, a second impedance connected between the other terminal of said field winding and said current converter through a switch, means responsive to the output of either one of said current converter and said voltage detector for detecting said ground fault, memory means for storing the outputs of said current converter and said voltage detector when said ground fault is detected by said ground fault detecting means, means for closing said switch for passing current from said other terminal of said field winding through said second impedance and said current converter when said ground fault is detected, and means for calculating grounding resistance of said ground fault by using the outputs of said current converter and of said voltage detector before and after closure of said switch thereby judging the magnitude of said ground fault.

2. The ground fault protective apparatus according to claim 1 further comprising a comparator for comparing the output of said calculating means with a predetermined reference value for producing a signal for disconnecting said dynamoelectric machine from an electric power system when said magnitude of the ground fault exceeds a predetermined value.

3. The ground fault protective device according to claim 1, which further comprises a computer including an input judging circuit responsive to the output of said current converter for producing an alarm signal whenever said ground fault occurs, a first memory circuit for storing the outputs of said current converter before and after closure of said switch, a second memory circuit for storing the outputs of said voltage detector before and after closure of said switch, a first subtractor connected to said first memory circuit for producing the difference between said outputs of said current converter, a second subtractor connected to said second memory circuit for producing the difference between said outputs of said voltage detector, and a division circuit for dividing the output of said first subtractor by the output of said second subtractor thereby determining said grounding resistance.

* * * * *